US008091219B2

(12) United States Patent
Crippen et al.

(10) Patent No.: US 8,091,219 B2
(45) Date of Patent: Jan. 10, 2012

(54) METHOD FOR ESTABLISHING A HIGH SPEED MEZZANINE CONNECTION

(75) Inventors: Martin Joseph Crippen, Apex, NC (US); Brian Michael Kerrigan, Cary, NC (US); Tony Carl Sass, Fuquay Varina, NC (US)

(73) Assignee: International Business Machines Corporation, Armonk, NY (US)

( * ) Notice: Subject to any disclaimer, the term of this patent is extended or adjusted under 35 U.S.C. 154(b) by 911 days.

(21) Appl. No.: 12/120,097

(22) Filed: May 13, 2008

(65) Prior Publication Data

US 2009/0070993 A1 Mar. 19, 2009

Related U.S. Application Data

(63) Continuation of application No. 11/856,436, filed on Sep. 17, 2007, now Pat. No. 7,390,194.

(51) Int. Cl.
*H05K 3/36* (2006.01)

(52) U.S. Cl. ................. 29/830; 29/825; 29/842; 439/65

(58) Field of Classification Search .................... 29/825, 29/830, 842
See application file for complete search history.

(56) References Cited

U.S. PATENT DOCUMENTS

| | | | | |
|---|---|---|---|---|
| 6,293,827 | B1 | 9/2001 | Stokoe | |
| 6,409,543 | B1 | 6/2002 | Astbury, Jr. et al. | |
| 6,517,360 | B1 | 2/2003 | Cohen | |
| 6,547,579 | B2 | 4/2003 | Kupnicki et al. | |
| 6,638,079 | B1 | 10/2003 | Billman et al. | |
| 6,663,427 | B1 | 12/2003 | Billman et al. | |
| 6,663,429 | B1 | 12/2003 | Korsunsky et al. | |
| 6,692,273 | B1 | 2/2004 | Korsunsky et al. | |
| 6,749,468 | B2 | 6/2004 | Avery | |
| 6,811,414 | B1 | 11/2004 | Consoli et al. | |
| 6,875,031 | B1 | 4/2005 | Korsunsky et al. | |
| 6,986,682 | B1 | 1/2006 | Jeon | |
| 7,079,381 | B2 * | 7/2006 | Brehm et al. | 361/679.33 |
| 7,088,583 | B2 * | 8/2006 | Brandon et al. | 361/694 |
| 7,104,808 | B2 | 9/2006 | Korsunsky et al. | |
| 7,113,401 | B2 * | 9/2006 | Becker et al. | 361/694 |
| 7,281,950 | B2 | 10/2007 | Belopolsky | |

* cited by examiner

*Primary Examiner* — Carl Arbes
(74) *Attorney, Agent, or Firm* — Cynthia G. Seal; Jeffrey L. Streets

(57) ABSTRACT

A reduced insertion force mezzanine connector is used to couple first and second circuit boards. In one embodiment a connector frame has a first end disposed against the first circuit board and defining a first wall, and an opposing second end disposed against the second circuit board and defining a second wall generally parallel with the first wall. A plurality of wafers are disposed. Each wafer has a first edge in sliding contact with the first wall and an opposing second edge in sliding contact with the second wall. A plurality of electrically conducting pathways extend along each wafer from the first edge to the second edge. A wafer guide structure defines a plurality of wafer-support aisles on the first and second walls for receiving the edges of the wafers to constrain the wafers with a fixed spacing and generally parallel alignment. A plurality of terminals are biased to protrude laterally into each wafer support aisle, and are spaced along the wafer support aisle such that each wafer is movable within the respective wafer support aisle between a first position, wherein each electrically conducting pathway is disposed between adjacent terminals, to a second position, wherein each electrically conducting pathway is in electrical contact with a terminal on the first wall and an associated terminal on the second wall.

4 Claims, 6 Drawing Sheets

METHOD FOR ESTABLISHING A HIGH SPEED MEZZANINE CONNECTION

STATEMENT REGARDING RELATED APPLICATIONS

This application is a continuation application of U.S. patent application Ser. No. 11/856,436 filed on Sep. 17, 2007.

BACKGROUND OF THE INVENTION

1. Field of the Invention

The present invention relates to electronic connectors. More particularly, the present invention relates to electronic connectors for connecting circuit boards.

2. Description of the Related Art

A variety of circuit boards and circuit board connectors are used in computer systems. The main circuit board ("main board") of a computer system such as a PC or server is typically referred to as a motherboard, having a plurality of electronic components connected by electrical communication pathways. Motherboard components include processors, drive controllers, video controllers, primary memory, interrupt controllers, and BIOS, as well as electronic connectors for interfacing with additional components. Electronic connectors are typically included with a main board for connecting additional circuit boards, such as a "daughter card," to provide electronic communication (i.e. the transfer of power and signal information) between the motherboard and the circuit boards to be connected. The terms "daughter card" and "daughter board" are routinely interchangeably used to refer to an extension or "daughter" of a motherboard or other main board. A daughter board may include plugs, sockets, pins, or connectors for attaching still other boards to the daughter card.

The term "mezzanine card" is often used to describe a daughter card mounted closely in parallel to a main board to expand the functionality of the main board. This closely-spaced, parallel arrangement helps achieve a compact form factor, which is particularly desirable in applications such as blade servers to minimize blade size and maximize blade density. The connector used to connect a mezzanine board to another circuit board may be referred to as a mezzanine connector. One practical application of a mezzanine board is to expand upon the functionality of the main board to which it attaches, without requiring a redesign of that main board or a redesign of the way in which the main board may attach to another circuit board. For example, a piece of hardware may be upgraded periodically by creating a new mezzanine card having additional or modified functionality, without necessitating a redesign of the main board, itself. One illustration of this mezzanine-type arrangement of circuit boards is the attachment of a MIDI daughter board parallel to a sound card, wherein the sound card itself is attached to a PC motherboard either in a mezzanine arrangement or at a selected angle with respect to the motherboard. The MIDI daughter board may be used to expand the functionality of the sound card without requiring a redesign of the main sound card or the way it attaches to the motherboard.

As electronic packaging becomes increasingly dense, the number and density of high-speed electronic connectors increases. Consequently, the mechanical integrity of circuit boards and supporting infrastructure is limited, such as in the case of thin blade servers. Such circuit boards and infrastructure may be prone to failure due to the relatively high mating forces between components, such as between two circuit boards. Conventional electronic connectors typically include two connector members each having an array of mating terminals or pins that are frictionally joined with one another as a result of mechanically coupling the two connector members. Thus, the forces required to mechanically couple the two connector members includes the force required to frictionally join a large number of mating terminals. Connecting the two connector members typically requires pressing one connector member into engagement with the other connector member, which applies a similar force to the two boards being connected, as well as to any supporting structure for the two boards. These forces and relative movement can damage the circuit boards or supporting structures. Furthermore, the individual pins on one connector are prone to damage if misaligned with the mating pins on the opposing connector prior to joining the circuit boards.

Therefore, improved connectors for electronic circuit boards are needed. One area for improvement would be to reduce the force required to connect two circuit boards. It would be desirable to provide a connector that can connect two circuit boards with zero insertion forces in order to avoid stress on the circuit boards. It would also be desirable to increase the reliability and durability of connectors so they are less prone to being damaged with use. Still further, it would be desirable if such a connector provided for the passage of cooling air flow so that it could be positioned anywhere on the circuit boards without adverse thermal affects.

SUMMARY OF THE INVENTION

The invention provides connectors and methods for connecting circuit boards. The connectors and methods may allow the circuit boards to be electronically coupled with a reduced insertion force or even a zero insertion force. A connector according to the invention may also allow air to flow through the connector, so that the position of the connector does not adversely reduce airflow to hot components.

A first embodiment provides a connector for coupling a first circuit board with a second circuit board. The connector includes a connector frame having a first frame member disposed against the first circuit board and defining a first wall, and an opposing second frame member disposed against the second circuit board and defining a second wall generally parallel with the first wall. A plurality of wafers is disposed within the connector frame between the first and second walls. Each wafer has a first edge in sliding contact with the first wall, an opposing second edge in sliding contact with the second wall, and a plurality of electrically conducting pathways extending from the first edge to the second edge. A wafer guide structure is disposed within the frame. The wafer guide structure defines a plurality of wafer-support aisles on each of the first and second walls. Each wafer support aisle on the first wall receives the first edge of a respective one of the plurality of wafers and each wafer support aisle on the second wall receives the second end of a respective one of the plurality of wafers. The wafer support aisles on the first wall are in generally opposing alignment with the wafer support aisles on the second wall to constrain the wafers with a fixed lateral spacing and generally parallel alignment. A plurality of terminals are spaced along the wafer support aisle such that each wafer is movable within the respective wafer support aisle between a first position wherein each electrically conducting pathway is not aligned for electrical contact with a terminal on the first wall and an opposing terminal on the second wall, and a second position wherein each electrically conducting pathway is aligned for electrical contact with a terminal on the first wall and an opposing terminal on the second wall.

A second embodiment provides a method of coupling a first circuit board with a second circuit board. A plurality of wafers are positioned within a connector frame between parallel first and second walls that are disposed against the first and second circuit boards, respectively. Each wafer has a first edge in sliding contact with the first wall, an opposing second edge in sliding contact with the second wall, and a plurality of electrically conducting pathways extending from the first edge to the second edge. The plurality of wafers are supported with a wafer guide structure disposed within the frame and which defines a plurality of wafer-support aisles on each of the first and second walls. Each wafer support aisle on the first wall receives the first edge of a respective one of the plurality of wafers and each wafer support aisle on the second wall receives the second end of a respective one of the plurality of wafers, to constrain the wafers with a fixed spacing and generally parallel alignment. A plurality of terminals disposed on the first circuit board are biased to protrude laterally into the wafer support aisles provided on the first circuit board and a plurality of terminals disposed on the second circuit board are biased to protrude laterally into the wafer support aisles provided on the second circuit board. The terminals are spaced along the wafer support aisles. Each wafer is moved within the respective wafer support aisle between a first position, wherein each electrically conducting pathway is not in electrical contact with one of the terminals on the first wall and an associated one of the terminals on the second wall, to a second position, wherein each electrically conducting pathway is in electrical contact with one of the terminals on the first wall and an associated one of the terminals on the second wall.

Other embodiments, aspects, and advantages of the invention will be apparent from the following description and the appended claims.

DETAILED DESCRIPTION OF PREFERRED EMBODIMENTS

The present invention provides reduced insertion-force electronic connectors for connecting electronic devices or components. The invention is well suited for producing circuit board connectors. The invention is particularly well suited for electronically and mechanically coupling a mezzanine card to a main board, and will be discussed extensively in that context. However, one skilled in the art having possession of this disclosure will appreciate that the invention may be applied to connectors for other types of hardware devices and components.

According to one aspect of the invention, first and second circuit boards may be mechanically coupled by joining a connector member secured to the first circuit board to a connector member secured to the second circuit board. After the two connector members are mechanically coupled, terminals of the first circuit board are selectively, electrically coupled to terminals of with the second circuit board. These terminals are electrically coupled by translating wafers having multiple electrically conducting pathways into a position wherein the conducting paths bridge the terminals to be electrically coupled. By mechanically coupling the two connector members prior to electrically coupling the two connector members, the step of electrically coupling the terminals does not contribute to the force required to mechanically couple the two connector members. This aspect minimizes the "insertion force" required to mechanically couple the two connector members, and potentially produces a connector with essentially "zero insertion force." Also, any forces generated during the step of electrically coupling the terminals may be confined to the connector, so that the main board or other components are not mechanically loaded. An electronic connector according to the invention also avoids the potential pin misalignment of the prior art, and helps ensure correct electrical coupling of associated terminals. Furthermore, a connector according to the invention allows airflow through the connector, which enhances the versatility of circuit board design. A connector may now be placed upstream of a hot component, such as a CPU or memory, without adversely reducing airflow to the hot component.

Figure 1:
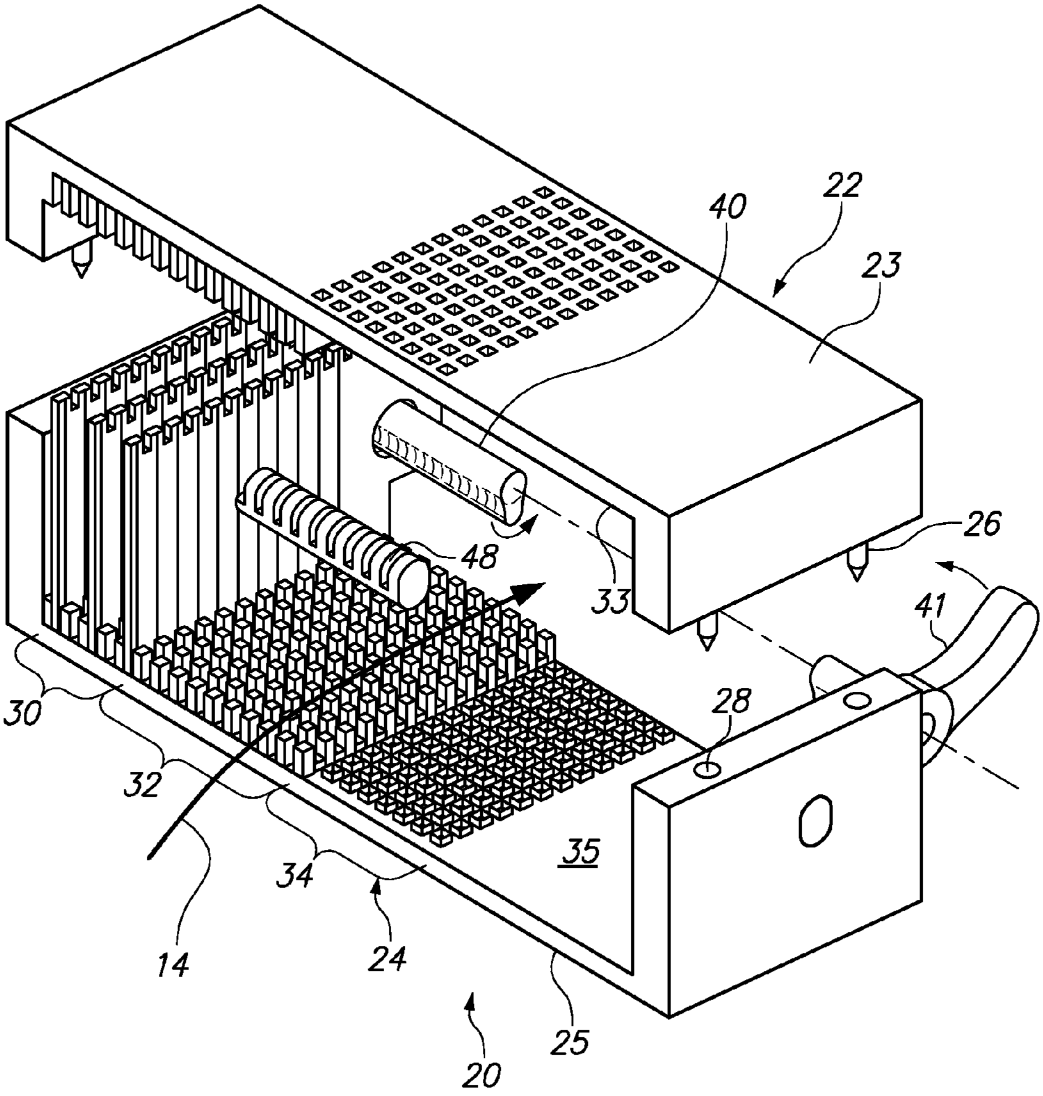
FIG. 1 a perspective view of a partially-assembled connector according to one embodiment of the invention.

FIG. 1 is a perspective view of a partially-assembled connector 20 according to one embodiment of the invention. The connector 20 includes a connector frame formed by selectively mechanically coupling a first frame member 22 with a second frame member 24 to enclose a plurality of wafers 30 within the frame. A variety of mechanisms are available in the art for mechanically coupling the first and second frame members 22, 24. The figure provides one example of such a coupling mechanism, which includes pins 26 disposed on the first frame member that mate with recesses 28 disposed on the second frame member 24. The pins 26 and corresponding recesses 28 may have a frictional fit or a snap fit, for instance, allowing a user to physically assemble the first and second frame members 22, 24. The pins 26 and recesses 28 provide sufficient retention between the frame members 22, 24 during use, while allowing the user to later non-destructively separate the first and second frame members. The first frame member 22 includes a face 23 disposed against a first circuit board (not shown) and the second frame member 24 includes a face 25 disposed against a second circuit board. The first and second frame members 22, 24 define an airflow channel allowing airflow through the connector 20 as generally indicated at 14.

The first and second frame members 22, 24 enclose the plurality of wafers 30 between first and second frame walls 33, 35. Only a fraction of the number of wafers 30 that may be included with the connector 20 are shown in this view. A rectangular array or grid of pegs 32 is disposed on the first wall 33 and on the second wall 35. A rectangular array or grid of electronically conductive terminals 34, preferably metallic, is also provided along the first and second walls 33, 35, interleaved in rows with the pegs 32. For clarity, only a portion of the pegs 32 and terminals 34 are shown, but the array of pegs 32 and terminals 34 are typically distributed all the way across the first and second walls 33, 35 in rows that are uniformly spaced and aligned as shown. The pegs 32 are just one example of a wafer guide structure used to constrain the wafers 30 with the fixed spacing and generally parallel alignment shown. An optional support rod 46 provides additional alignment and support to the wafers 30. When the first frame member 22 is mechanically coupled to the second frame member 24 as described above, the second edge of each wafer 30 rides in an aisle between adjacent rows of interleaved pegs 32 and terminals 34 on the second wall and the first edge of each wafer 30 rides in an aisle between adjacent rows of interleaved pegs 32 and terminals 34 on the first wall 33.

The wafers 30 are movable within their respective aisles to selectively bridge the terminals 34 provided on the first wall 33 with corresponding terminals 34 provided on the second wall 35, as further discussed below. The corresponding terminals are preferably those terminals that are directly opposed to each other on the first and second walls. In one variation, the wafers 30 may be movable by hand, such as from a first position to a second position, and the wafers may be retained by friction in the position to which they are moved. Alternatively, a variety of mechanisms may be employed to move the wafers 30. One non-limiting example of such a mechanism is schematically shown in the figures as an eccentric cam rod 40. The cam rod 40 passes through the wafers 30 and is rotatably secured to the second frame member 24. A lever 41 is secured to the cam rod 40. Rotating the lever 41 in the direction shown rotates the cam rod 40, to move the wafers 30 within their respective aisles. Rotating the lever 41 in one angular direction translates the wafers 30 in one transverse direction, such as to a first position, and rotating the lever 41 in another angular direction translates the wafers 30 in the opposite transverse direction, such as to a second position. [What are other examples of mechanisms for moving the wafers?]

Figure 2:
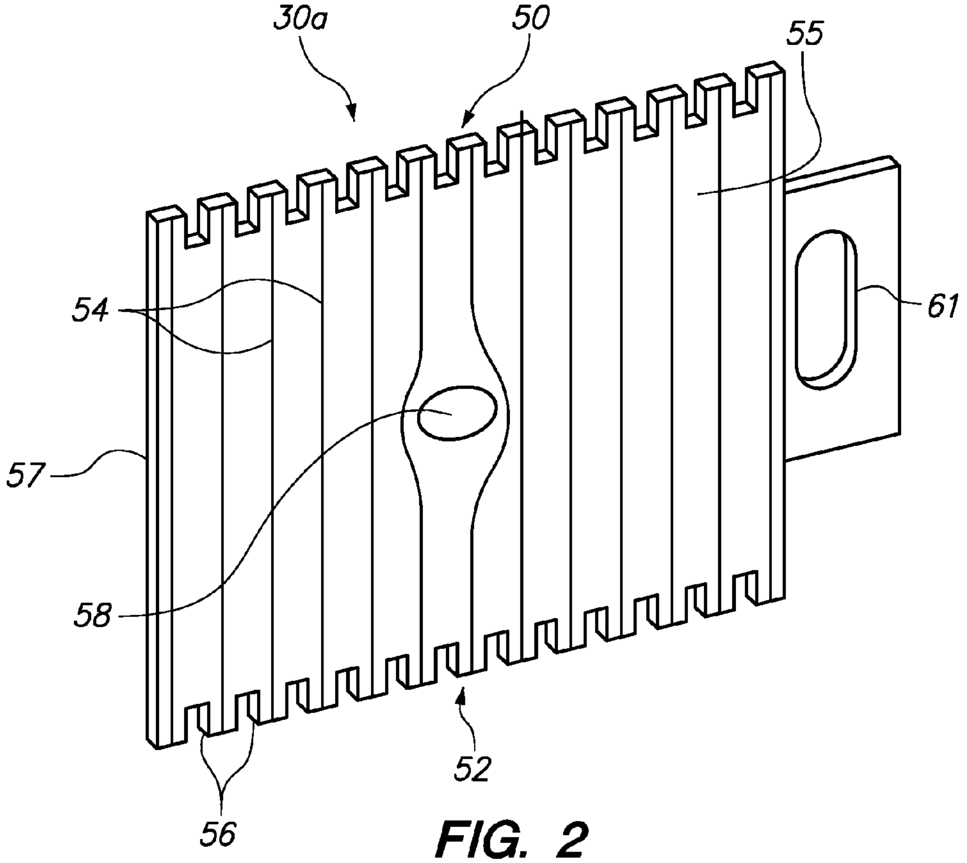
FIG. 2 is an enlarged perspective view of one of the wafers.

FIG. 2 is an enlarged perspective view of one of the wafers 30. The wafer 30 comprises a substantially non-conducting substrate typical of substrates used in circuit boards. A plurality of electrically conducting pathways 54, which in the context of circuit boards are commonly referred to as "traces", extend from a first edge 50 of the wafer 30 to a second edge 52. The electrically conducting pathways 54 may be provided as shown, along a first face 55 and along an opposing second face 57 of the wafer 30. A support through-hole 58 is provided to receive the optional support rod 48 and a cam through hole 61 is provided to receive the cam rod 40 (FIG. 1). The electrically conducting pathways 54 are strategically routed to avoid the support through-hole 58. A plurality of relief openings 56 are provided along the first and second ends 50, 52, passing through the wafer 30 from the first face 55 to the second face 57. The relief openings 56 pass through the wafer 30, between the electrically conducting pathways 54. The utility of the optional relief openings 56 will be further apparent with reference to subsequent figures.

Figure 3A:
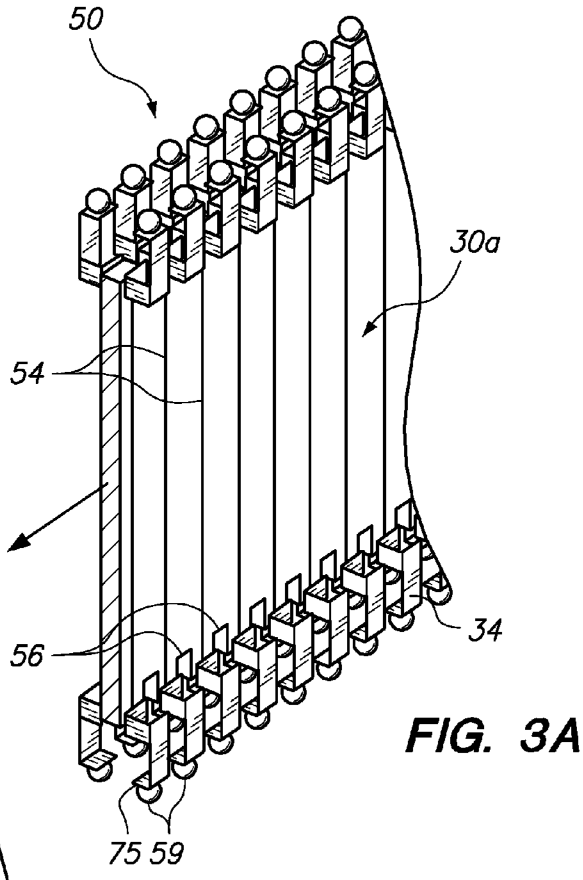
FIG. 3A is an enlarged, perspective view of one of the wafers in a "first position"wherein the electrically conducting pathways are separated from the terminals and are aligned with the relief openings.

FIG. 3A is an enlarged, perspective view of one of the wafers 30 in a "first position"wherein the electrically conducting pathways 54 are not aligned or in contact with the terminals 34. Rather, the relief openings 56 are aligned with the terminals 34. The pegs 32 and the second wall 35 of FIG. 1 are removed from this view to more clearly shown the alignment of the components. The aisles between rows of pegs constrain and guide translation of the wafer 30, as described above. Thus, the wafer 30 can be translated from the first position of FIG. 3A to a "second position" shown in FIG. 3B, wherein the electrically conducting pathways 54 are moved along the row into alignment and electrical contact with the terminals 34, while the relief openings 56 align with the pegs 32 (not shown). Thus, each electrically conducting pathway 54 electrically bridges one of the terminals 34 at the second end 52 of the wafer 30 to a corresponding one of the terminals 34 at the first end 50. Solder balls 59 are provided at each terminal 34, and may be used to solder the terminals 34 to associated electrical contacts on the circuit boards to be connected. The wafer 30 can be selectively moved between the first position of FIG. 3A and the second position of FIG. 3B, to selectively bridge the terminals at the first edge 50 with the terminals 34 at the second edge 52, to selectively couple or de-couple the two circuit boards.

Figure 4:
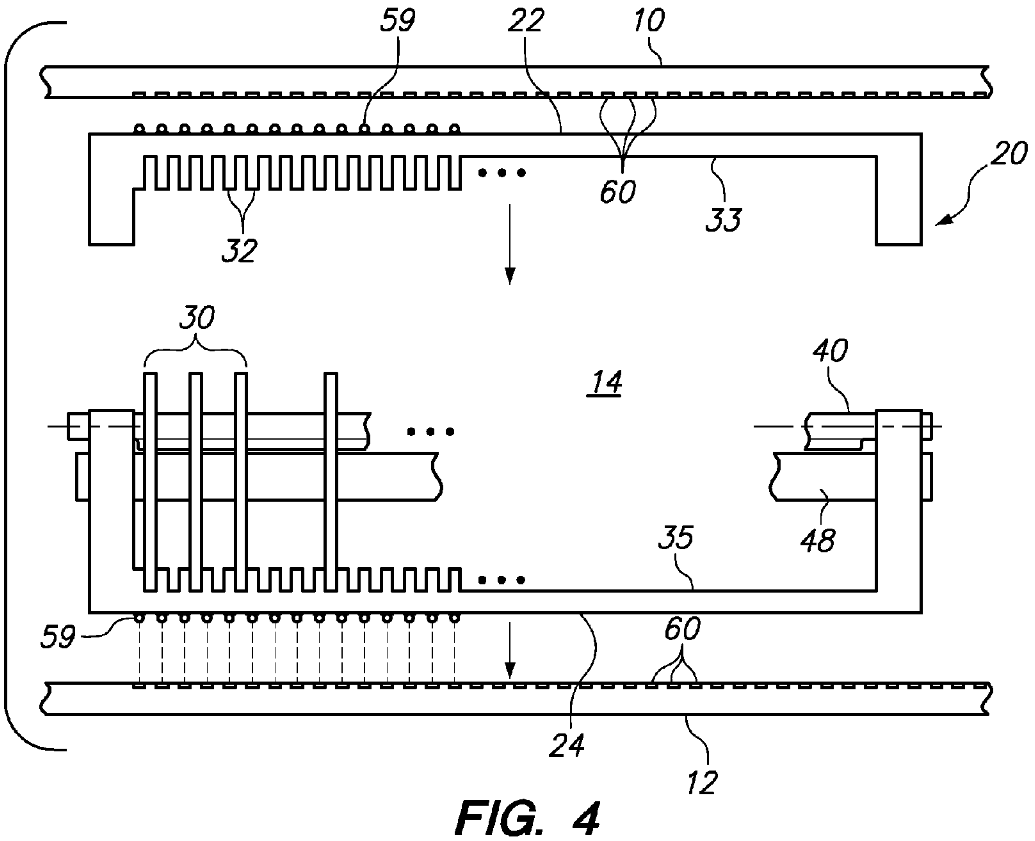
FIG. 4 is an exploded side view of the connector with a first circuit board and a second circuit board to be connected using the connector.

FIG. 4 is an exploded side view of the connector 20 juxtaposed with a first circuit board 10 and a second circuit board 12 to be connected using the connector 20. The first circuit board 10 may be, for example, a mezzanine card, and the second circuit board 12 may be, for example, a main board to which the mezzanine card is to be connected. The first and second circuit boards 10, 12 each include a plurality of electrical contacts 60. The electrical contacts 60 on circuit board 10 are connected to circuit board components residing on the circuit boards 10 by electrical communication pathways etched on the circuit board 10 (not shown). The electrical contacts 60 on the circuit board 12 are connected to circuit board components residing on the circuit board 12 by electrical communication pathways etched on the circuit board 12 (not shown). Using the connector 12, the circuit board 10 may be electronically coupled with the circuit board 12, thereby placing the first and second circuit boards 10, 12 in electronic communication, thus allowing the circuit board components of the first circuit board 10 to communicate with the circuit board components of the second circuit board 12.

Figure 3B:
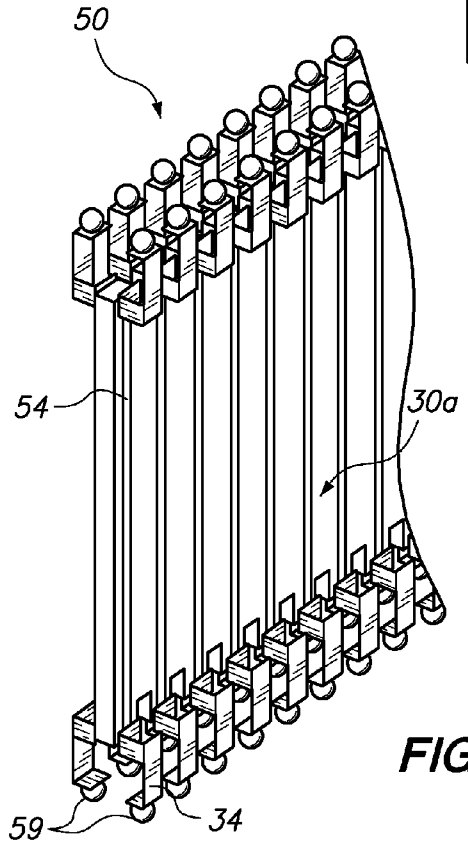
FIG. 3B is an enlarged, perspective view of one of the wafers in a "second position,"wherein the electrically conducting pathways are moved away from the relief openings and are in electrical contact with the electrically conducting pathways.

The terminals 34 (as shown in FIGS. 3A and 3B) are hidden behind the pegs 32 in this view, but extend through the first and second walls 33, 35 of the connector 20 to position the visible solder balls 59 as shown with respect to the connector frame members 22, 24. The solder balls 59 correspond in one-to-one relationship with the contacts 60 on the circuit boards 10, 12. The solder balls 59 may be secured to the contacts 60 using any of a variety of techniques, such as by inducing an electrical current through the terminals 34 to flash heat the solder balls 59 and melt them to the contacts 60. Additional means (not shown) known in the art may also be included to further mechanically secure the first frame member 22 to the first circuit board 10 and the second frame member 24 to the second circuit board 12. Thus, the first frame member 22 may be an integral part of the first circuit board 10 and the second frame member 24 may be an integral part of the second circuit board 12. The first circuit board 10 may be electronically coupled to the second circuit board 12 by moving the wafers 30 from the first position of FIG. 3A to the second position of FIG. 3B.

The airflow channel 14 allows air to flow through the connector 20 between the first and second walls 33, 35, even when connected. The airflow channel 14 is particularly desirable for providing greater versatility in component layout on the circuit boards 10, 12. Prior art connectors do not permit airflow through the connector, and typically must be placed downstream from hot components such as CPUs and memory. However, the ability for air to flow through this embodiment of the connector 20 allows the connector 20 to be placed either upstream or downstream from hot components. A circuit board designer is much less limited in where components are to be placed, because the connector 20 will typically not impede airflow sufficiently to cause a problem for hot components.

As shown, it is not required to space all of the wafers 30 at regular intervals. The wafer position may be selected according to a particular application. Not every position capable of receiving a wafer is required to do so. For example, the board designer may have specific requirements for which certain contacts 60 of the first circuit board 10 are to be connected to certain corresponding contacts 60 of the second circuit board 12, and may position the wafers 30 at selected locations, accordingly, while leaving other locations empty. In this embodiment, however, it should be noted that the wafers 30 are spaced with at least the minimal spacing shown on the left side of FIG. 4, for reasons that will be more apparent from the discussion with respect to FIG. 5.

Figure 5:
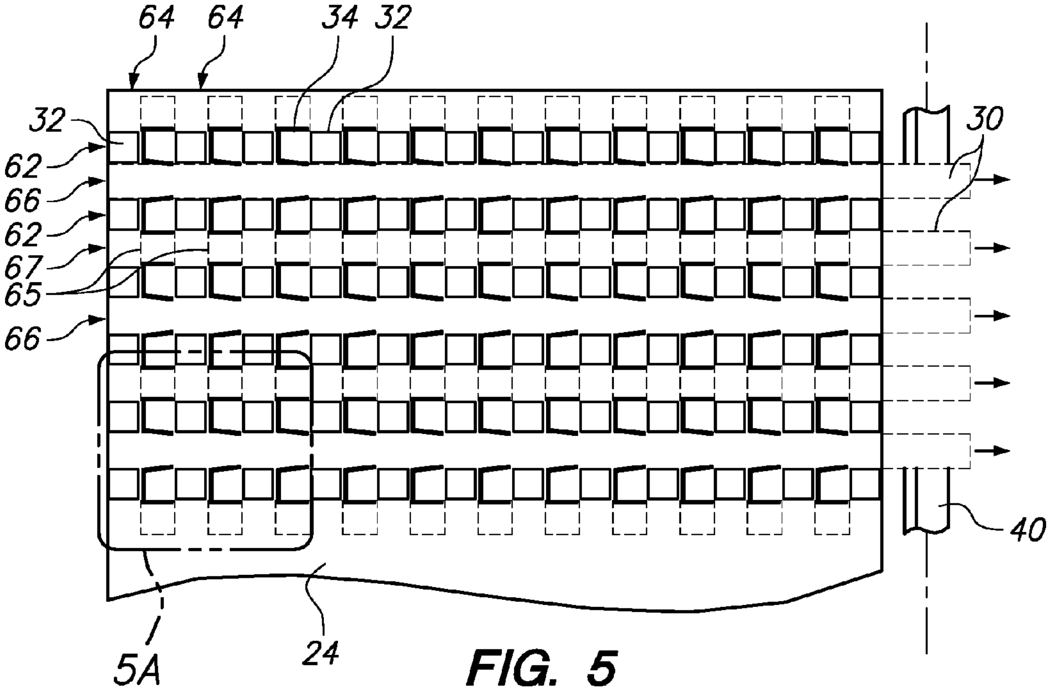
FIG. 5 is a plan view of the second frame member, schematically illustrating the layout of the wafer support structure.

FIG. 5 is a plan view of the second frame member 24, schematically illustrating the layout of the pegs 32, terminals 34, and other elements along the second wall 35 in this embodiment. A substantially "mirror image" layout may be provided on the first wall 33 of the first frame member 22 (not shown). The pegs 32 are arranged in a rectangular array or grid, forming a plurality of rows 62 and columns 64. The rows 62 define aisles 66 between the rows 62 for receiving the wafers 30 at their second edges. Aisles 66 for receiving wafers 30 are shown to alternate with other aisles 67 each having a plurality of openings 65 in the second wall 35. The openings 65 provided in the other aisles 67 are intended for receiving the terminals 34 during assembly. In this embodiment, wafers 30 are not positioned in these other aisles 67, giving the appearance that the wafers 30 are positioned only every other aisle. However, the regular array of evenly spaced rows and columns in this embodiment is provided to facilitate an understanding of the invention, and the aisles 67 are not necessarily required at all and would not have to be the same width as the aisles 66. Thus, a higher wafer density may be achieved even in this embodiment by maintaining the width of the aisles 66 while decreasing the spacing between rows 62 that define the aisles 67. In their final, as-assembled position shown in FIG. 5, the terminals 34 are in general alignment with the rows 62, interleaved with the pegs 32. The terminals 34 each slightly protrude laterally into one of the aisles 66 for contacting the wafers 30. Detail 5A is further illustrated in FIG. 6A and detail 5B is further illustrated in FIGS. 7 and 8.

Figure 6A:
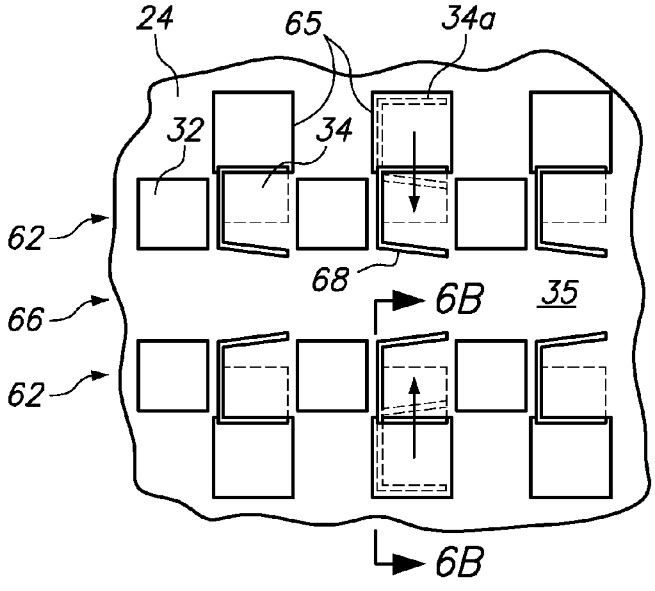
FIG. 6A is an enlarged view of detail 5A of FIG. 5.

FIG. 6A is an enlarged view of detail 5A of FIG. 5. The second wall 35 includes the plurality of openings 65 positioned as shown. During manufacturing and/or assembly of the connector 20, each terminal 34 is inserted through the opening 65 in a direction perpendicular to the second wall 35 (out of the page in this view), into an intermediate position 34A. Each terminal 34 is then moved laterally, parallel to the second wall 35, from the intermediate position 34A to the final, assembled position 34B. In the final position 34B, each terminal 34 is generally aligned with one of the rows 62 of pegs 32. In this enlarged view, it can be seen that a contact portion 68 of each terminal 34 is biased to laterally protrude slightly into one of the aisle 66 while the terminals 34 are in their final position 34B. This protrusion into the aisle 66 ensures contact between the terminals 34 and corresponding electrically conducting pathways 54 when the wafers 30 are in the second position of FIGS. 3B and 8.

Figure 6B:
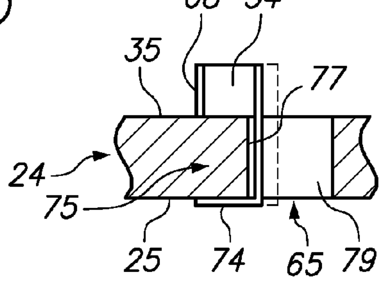
FIG. 6B is a sectioned side view illustrating how the terminal 34A is secured to the first frame member 24 in FIG. 6A

FIG. 6B is a sectioned side view illustrating how the terminal 34 is secured to the first frame member 24 in FIG. 6A. After inserting the terminal 34 into the hole 65 (in a vertical direction in this view), the terminal 34 may then be pressed laterally (to the left in this view) into position on an inner edge 77 of the wall 35 at the perimeter of the hole 65. The terminal 34 forms a C-shaped channel 75 for frictionally receiving the inner edge 77 of the wall 35. The lower end of the C-shaped channel 75 includes a retaining flange 74 that engages the face 25. The terminal 34 may "snap" into the position shown. The terminal 34 is laterally constrained (perpendicular to the page) by the sides 79 of the hole 65. The terminal 34 may be further secured in the position shown by various fastening mechanisms and methods known in the art, such as brazing, tack-welding, or gluing the terminal 34 in the position shown.

Figure 7:
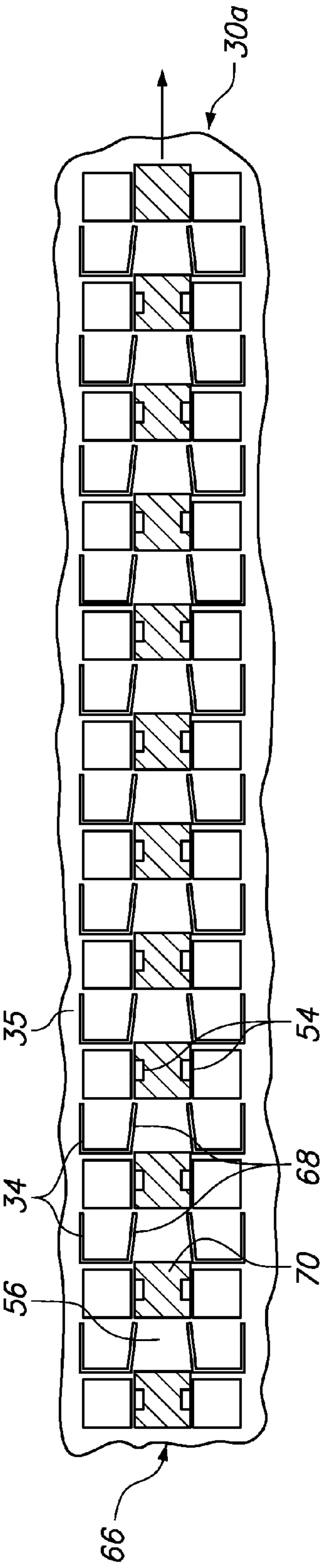
FIG. 7 is a plan view of one of the wafers of FIG. 5 in the first position.

FIG. 7 is an enlarged schematic view of the wafer 30 in the first position of FIG. 3A. The relief openings 56 first described in FIG. 2 are shown positioned between a plurality of wafer teeth 70 on the second edge 52 of the wafer 30. Being at the second edge 52, the wafer teeth 70 are therefore in sliding engagement with the second wall 35. In this first position of the wafer 30, the wafer teeth 70 are staggered with respect to the terminals 34, so that the electrically conducting pathways 54 are positioned between and separated from the terminals 34. More particularly, in this embodiment, contact portion 68 of the terminals 34 are permitted to protrude slightly into the aisle 66, due to alignment of the contact portion 68 with the relief opening 56. In other embodiments, however, the relief portions 56 may be omitted, in which case the contact portion 68 of the terminals 34 will instead be positioned between the electrically conducting pathways 54 in contact with the non-conducting substrate of the wafer 30. In such a case, the terminals 34 may still be described as being biased toward the aisle 66, even if the presence of the continuous wafer prevents their actual protrusion into the aisle 66. One advantage of including the relief portion 56 is that the terminals 34 may have an increased mechanical wear life, due to the fact that they are only loaded when the wafer 30 is in the second position of FIG. 3B.

Figure 8:
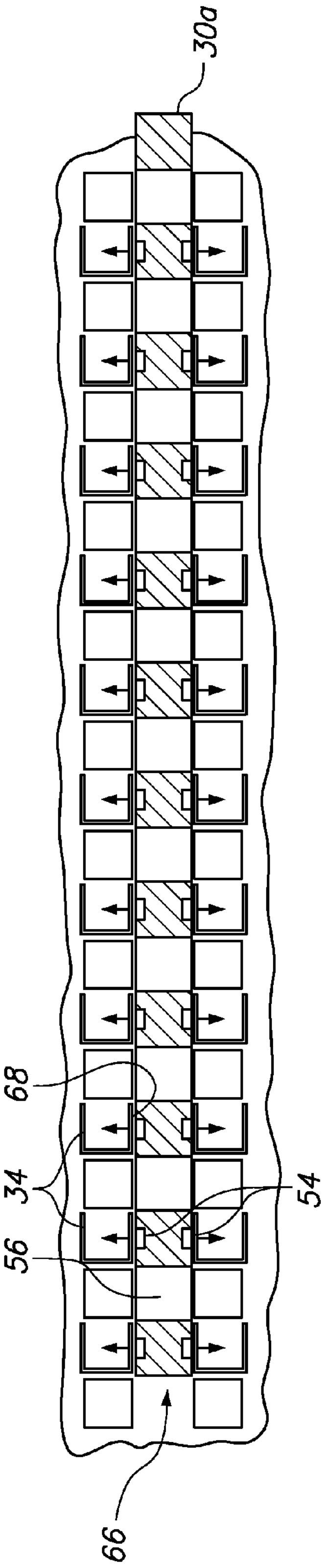
FIG. 8 is a plan view of one of the wafers of FIG. 5 in the second position.

FIG. 8 is an enlarged view of the wafer 30 moved in the direction indicated to the second position of FIG. 3B. Now, the wafer teeth 70 are in general alignment with the terminals 34, and the electrically conducting pathways 54 are in contact with the terminals 34. As the wafer 30 is moved from the first position to the second position to align the teeth 70 with the terminals 34, the teeth 70 engage the contact portion 68 of the terminals 34, urging that portion 68 of the terminals 34 inwardly. The terminals 34 are made of an electrically conducting, mechanically flexible or "springy" material such as gold or copper. The flexible (elastically deformable) properties of the material from which the terminals 34 are constructed provides a positive engagement between the contact portion 68 of the terminals 34 with the electrically conducting pathways 54. When the wafer 30 is subsequently returned to the first position (FIGS. 3A and 7), the contact portion 68 springs back into the aisle 66.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred,""prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of coupling a first circuit board with a second circuit board, comprising:

providing a plurality of wafers positioned within a connector frame between parallel first and second walls secured to the first and second circuit boards, respectively, each wafer having a first edge in sliding contact with the first wall, an opposing second edge in sliding contact with the second wall, and a plurality of electrically conducting pathways extending from the first edge to the second edge, wherein the plurality of wafers are supported with a wafer guide structure disposed within the frame and defining a plurality of wafer-support aisles on each of the first and second walls, each wafer support aisle on the first wall receiving the first edge of a respective one of the plurality of wafers and each wafer support aisle on the second wall receiving the second end of a respective one of the plurality of wafers, to constrain the wafers with a fixed spacing and generally parallel alignment, and wherein a plurality of terminals disposed on the first circuit board are biased to protrude laterally into the wafer support aisles provided on the first circuit board and a plurality of terminals disposed on the second circuit board are biased to protrude laterally into the wafer support aisles provided on the second circuit board, the terminals being spaced along the wafer support aisles; and moving each wafer within the respective wafer support aisle between a first position, wherein each electrically conducting pathway is not in electrical contact with one of the terminals on the first wall and an associated one of the terminals on the second wall, to a second position, wherein each electrically conducting pathway is in electrical contact with one of the terminals on the first wall and an associated one of the terminals on the second wall.

2. The method of claim 1, further comprising removably securing a first frame member defining the first wall to a second frame member defining the second wall to enclose the wafers between the first and second frame member.

3. The method of claim 1, further comprising flowing air generally parallel to the first and second circuit boards through an airflow channel defined by the first and second walls of the connector frame.

4. The method of claim 1, further comprising electronically coupling the first and second circuit boards by rotating a cam member passing through the wafers and rotatably connected to the connector frame to move the wafers together from the first position to the second position.

* * * * *